United States Patent
Lin et al.

(10) Patent No.: US 7,037,816 B2
(45) Date of Patent: May 2, 2006

(54) SYSTEM AND METHOD FOR INTEGRATION OF HFO₂ AND RTCVD POLY-SILICON

(75) Inventors: Yu Min Lin, Jhongli (TW); Ming-Fang Wang, Shengang Township, Taichung County (TW); Kun-Chih Lee, Sinhua Township, Tainan County (TW); Ming-Ho Yang, Hsin-Chu (TW); Liang-Gi Yo, Hsin-Chu (TW); Shih-Chang Chen, Jhudong Township, Hsinchu County (TW); Karen L. Mai, Jhonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 50 days.

(21) Appl. No.: 10/763,643

(22) Filed: Jan. 23, 2004

(65) Prior Publication Data

US 2005/0164445 A1 Jul. 28, 2005

(51) Int. Cl.
H01L 21/4763 (2006.01)

(52) U.S. Cl. ..................................... 438/585
(58) Field of Classification Search ................ 438/240, 438/261, 287, 585, 591, 770–772, 765, 775–778, 438/785
See application file for complete search history.

(56) References Cited

U.S. PATENT DOCUMENTS

| 4,672,419 | A | 6/1987 | McDavid |
| 5,789,312 | A | 8/1998 | Buchanan et al. |
| 6,091,122 | A | 7/2000 | Buchanan et al. |
| 6,207,561 | B1 | 3/2001 | Hwang et al. |
| 6,287,918 | B1 | 9/2001 | Xiang et al. |
| 6,348,386 | B1 | 2/2002 | Gilmer |
| 6,355,561 | B1 | 3/2002 | Sandhu et al. |
| 6,376,888 | B1 | 4/2002 | Tsunashima et al. |
| 6,472,337 | B1 | 10/2002 | Zhuang et al. |
| 6,482,740 | B1 | 11/2002 | Soininen et al. |
| 6,504,203 | B1 | 1/2003 | Gambino et al. |
| 6,511,875 | B1 | 1/2003 | Park et al. |
| 6,515,320 | B1 | 2/2003 | Azuma et al. |
| 6,809,370 | B1 * | 10/2004 | Colombo et al. ........... 257/310 |
| 2001/0038136 | A1 | 11/2001 | Abiko |
| 2002/0081826 | A1 * | 6/2002 | Rotondaro et al. ......... 438/585 |
| 2002/0084486 | A1 | 7/2002 | Chau et al. |
| 2002/0098627 | A1 * | 7/2002 | Pomarede et al. .......... 438/149 |

(Continued)

OTHER PUBLICATIONS

World Wide Web, www.mrs.org/publications/jmr/jmra/2003/jan/009.html, Choi, Kyu-Jeong, et al., "Ultrathin HfO₂ Gate Dielectric Grown by Plamsa-Enhanced Chemical Vapor Deposition Using Hf [OC(CH₃)₃]₄ as a Precursor in the Absence of O₂", printed on Mar. 4, 2003, 1 page.

(Continued)

Primary Examiner—Asok Kumar Sarkar
(74) Attorney, Agent, or Firm—Haynes and Boone, LLP

(57) ABSTRACT

A method for fabricating a portion of an integrated circuit on a semiconductor substrate. The method includes cleaning the surface of the substrate, and forming a thin insulate over the substrate. The method also includes depositing a high dielectric constant (high-k) material over the thin insulate, and then performing a hydrogen-based anneal on the high-k material. The method further includes performing an oxygen-based anneal on the high-k material, wherein the hydrogen-based and oxygen-based anneals occur sequentially.

55 Claims, 4 Drawing Sheets

U.S. PATENT DOCUMENTS

2002/0192975 A1* 12/2002 Ahn et al. .................. 438/722
2004/0178448 A1* 9/2004 Rayssac et al. ............. 257/347
2005/0124121 A1* 6/2005 Rotondaro et al. ......... 438/287

OTHER PUBLICATIONS

King, Susan J., "Characterising the Interface Trap Density of Si:P Quantum Computer Devices", School of Electrical Engineering & Telecommunicatons, 2002, 1 page.

Lin, Y.S., et al, "Dielectric Property and Thermal Stability of $HfO_2$ on Silicon", Applied Physics Letters, vol. 81, No. 11, Sep. 9, 2002, pp. 2041-2043.

Rashkeev, S.N., et al, "Physical Model for Enhanced Interface-Trap Formation at Low Dose Rates", Basic Mechanisms, Oral Presentation, Example Summary, 5 pages.

* cited by examiner

SYSTEM AND METHOD FOR INTEGRATION OF HFO₂ AND RTCVD POLY-SILICON

BACKGROUND

The present disclosure relates generally to the field of semiconductor processing and, more particularly, to a method and system for improving electrical characteristics of dielectrics having a high dielectric constant.

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. For example, current fabrication processes are producing devices having geometry sizes (e.g., the smallest component (or line) that may be created using the process) of less than 0.1 µm. However, the reduction in size of device geometries frequently introduces new challenges that need to be overcome.

As semiconductor devices, such as metal oxide semiconductor field effect transistors (MOSFETs), are scaled below 0.1 µm, ultra thin $SiO_2$ gate oxide dielectric films that form portions of the devices may exhibit undesirable leakage current. In order to minimize leakage current while maintaining high drive current, high equivalent oxide thickness (EOT) may be achieved by using thinner films with higher dielectric constants (k). EOT is a thickness value used to compare the performance of MOS gate dielectrics having a dielectric constant that is different than $SiO_2$ with the performance of $SiO_2$ MOS gate dielectrics. For example, EOT may be used to represent the $SiO_2$ gate oxide thickness required to obtain the same gate capacitance as would be obtained with the alternate dielectric featuring the different dielectric constant k. One method of reducing the EOT is by placing a high-k dielectric film (a film having a dielectric constant k greater than that of $SiO_2$) immediately over the gate of a MOSFET or over the area where the high-k dielectric becomes the gate of a MOSFET. However, high-k dielectric films may not have the desired electrical properties needed for a particular device design, and therefore, post processing may be necessary. Such post processing adds complexity to the fabrication process and increases production time and costs.

Accordingly, what is needed in the art is a integrated circuit device and method thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
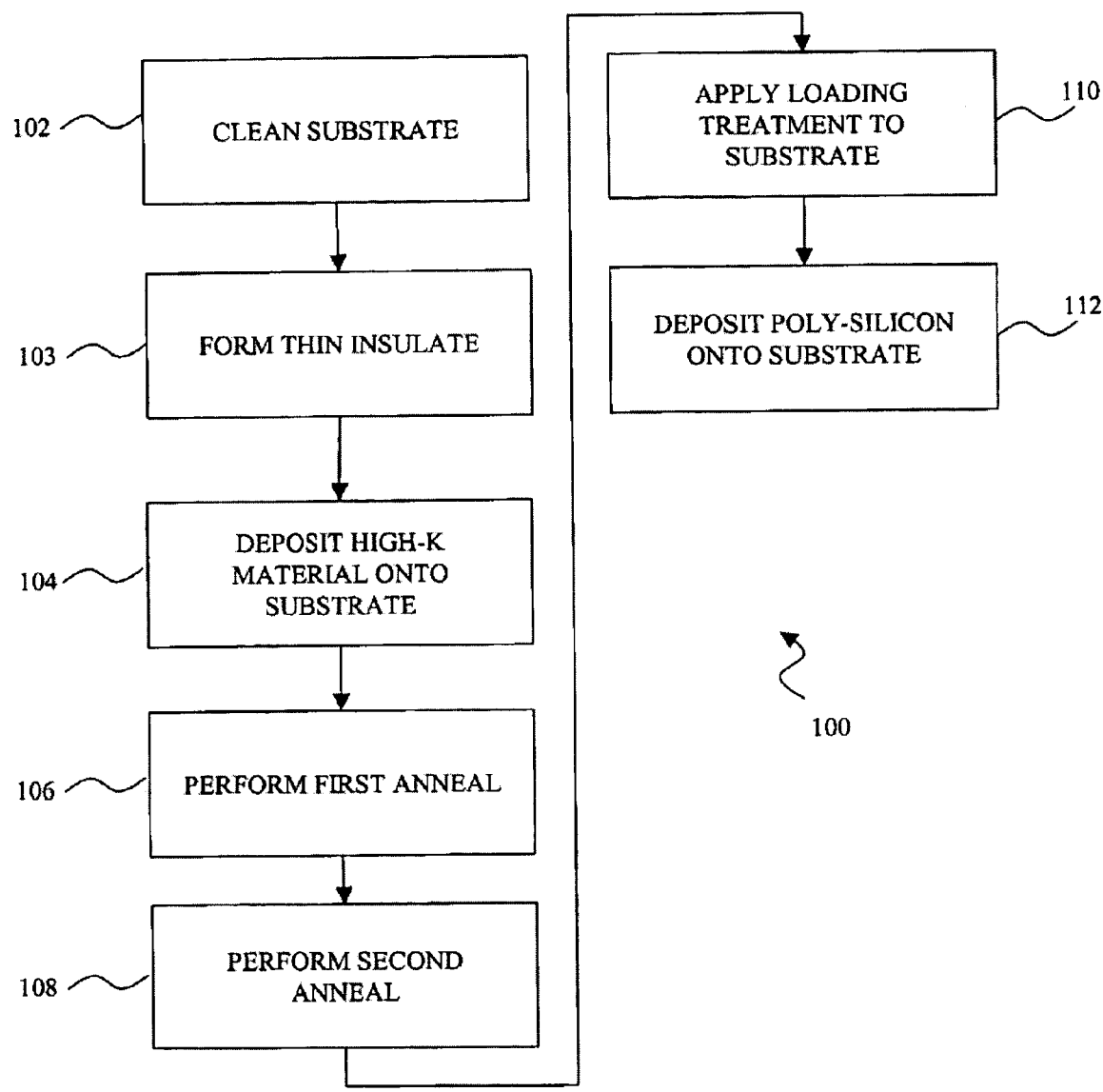
FIG. 1A illustrates a method for integrating transistor gate deposition processes to produce a semiconductor device having improved electrical characteristics.

It is understood that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1A and with additional reference to FIGS. 2A–2D, in one embodiment, a method 100 illustrates a portion of a fabrication process that may be used to produce a semiconductor device, such as a metal oxide semiconductor (MOS) device. It is understood that the MOS device may be a positive-channel MOS (PMOS) structure or a negative-channel MOS (NMOS) structure, and may have a single finger design or a multiple finger design. In the present example, the method 100 is used in the fabrication of a gate on the MOS device.

The method 100 may begin after other fabrication steps have been completed. For example, referring to FIG. 2A, prior to the start of the method 100, formation of a device 200 may have commenced over or on a substrate 202. The substrate 202 may comprise silicon, silicon-on-insulator (SOI), and/or diamond. The substrate 202 may be n-type doped or p-type doped, and is n-type doped in the present example for purposes of illustration. The substrate 202 may be provided with one or more isolation features (not shown). The isolation features may comprise local oxidation of silicon (LOCOS) structures and/or shallow trench isolation (STI) structures that are formed in the substrate 202 to electrically isolate device areas.

A well region 204 may be formed in the substrate 202 by ion implantation (although use of a p-type doped substrate may negate the need for a well region). For example, the well region 204 may be formed by growing a sacrificial oxide on the substrate 202, opening a pattern for the location of the well, and then using a chained-implantation procedure. It is understood that the substrate 202 may have a p-type doped well, an n-type doped well, and/or a combination thereof. While not limited to any particular dopant types or schemes, in one embodiment, the well region 204 may employ boron as a p-type dopant and deuterium-boron complexes for an n-type dopant. The deuterium-boron complexes may be formed by plasma treatment of boron-doped diamond layers with a deuterium plasma.

In one embodiment, the well region 204 may be formed using a high density plasma source with a carbon-to-deuterium ratio ranging between about 0.1 percent and about 5 percent in a vacuum process ambient. Boron doping may be provided by the mixing of a boron containing gas with a carbon/hydrogen gas. The boron containing gas may include $B_2H_6$, $B_2D_6$, and/or other boron containing gases. The concentration of boron doping may depend upon the amount of boron containing gas that may be leaked or added into the process. The process ambient pressure may range between about 0.1 mTorr and about 500 Torr. The substrate 202 may be held at a temperature ranging between about 150° C. and about 1100° C. High density plasma may be produced by a microwave electron cyclotron resonance (ECR) plasma, a helicon plasma, an inductively coupled plasma, and/or other high density plasma sources. For example, the ECR plasma may utilize microwave powers ranging between about 800 Watts and about 2500 Watts.

As described above, the well region 204 may also comprise n-type deuterium-boron complex regions of the substrate 202, which may be formed by treating the above-described boron-doped regions employing a deuterium plasma. For example, selected areas of the substrate 202 may be covered by photoresist or another type of mask such that exposed boron-doped regions may be treated with the deuterium containing plasma. The deuterium ions may provide termination of dangling bonds, thereby transmuting the p-type boron-doped regions into n-type deuterium-boron complex regions. Alternatively, deuterium may be replaced with tritium, hydrogen and/or other hydrogen containing gases. The concentration of the n-type regions may generally be controlled by a direct current (DC) or a radio frequency (RF) bias of the substrate 202. The above-described processes may also be employed to form lightly-doped source/drain regions in the substrate 202. Of course, other conventional and/or future-developed processes may also or alternatively be employed to form the source/drain regions.

Figure 2A:
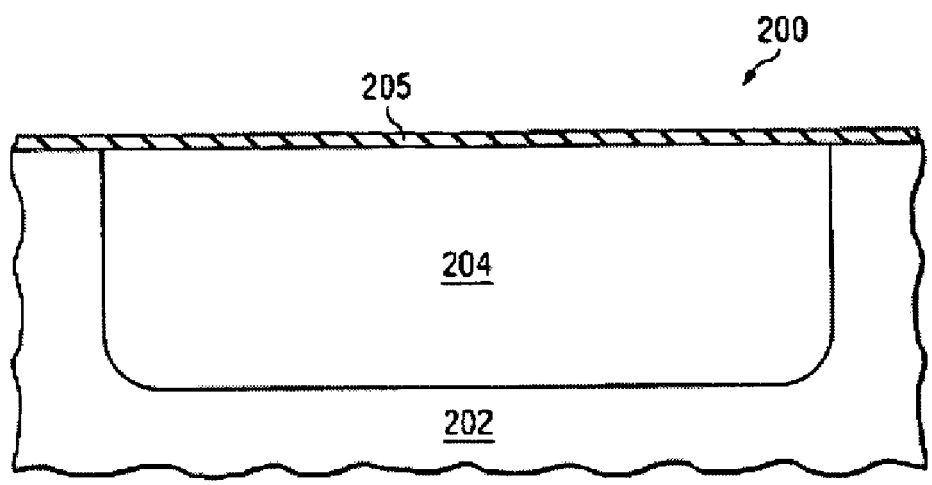
FIGS. 2A–2D are cross-sectional views of an exemplary integrated circuit produced by a fabrication process that utilizes the method of FIG. 1.

Referring again to FIG. 1A, the method 100 begins in step 102 with the cleaning of the substrate 202 (FIG. 2A). The substrate 202 may be cleaned using one or more chemical cleaners and cleaning methods. For example, the chemical cleaner may be a mixture of $H_2SO_4$ and $H_2O_2$ (commonly known as sulfuric peroxide mix (SPM)) that may be used for removing native oxides. Other exemplary chemical cleaners and cleaning methods include a mixture of ammonium hydroxide ($NH_4OH$), hydrogen peroxide ($H_2O_2$) and deionized (DI) water, commonly referred to as an "SC1 clean," as well as a mixture of hydrochloric acid (HCl), hydrogen peroxide ($H_2O_2$), and deionized (DI) water, commonly referred to as an "SC2 clean." The chemical cleaning may be carried out in an high vacuum environment to prevent the formation of an ultra thin oxide that may occur if the substrate 202 is cleaned in an ambient environment.

In step 103 of FIG. 1A and with additional reference to FIG. 2A, a thin insulate 205 may optionally be deposited or formed over or on the cleaned substrate 202. The thin insulate 205 may be formed by a plurality of different methods. For example, the thin insulate 205 may be formed upon exposure to air wherein about 3 Angstroms to about 15 Angstroms of native oxide may form on the semiconductor substrate 202. Alternatively, the cleaned substrate 202 may proceed to a process where the thin insulate 205 of $SiO_2$ may be formed by a low temperature RTP or thermal process. The transfer to the process for forming the thin insulate 205 may be under an inert gas or vacuum environment. Formation of the thin insulate 205 may include an Ar plasma clean prior to the growth of the thin insulate 205. Native oxide may be cleaned from the substrate 202 by the plasma clean and the thin insulate 205 may be deposited insitu of the plasma clean. The thin insulate 205 may comprise a variety of different materials including $SiO_2$, SiC, CN, and SiOC. The thin insulate 205 may be used as a MOS gate oxide, and may be a thermal oxide, carbon nitride, or any other appropriate gate dielectric film. In some examples, the thin insulate 205 may be too thin to be of any appreciable significance, and in other examples, it may be formed so as to have a thickness suitable for a gate oxide.

Figure 2B:
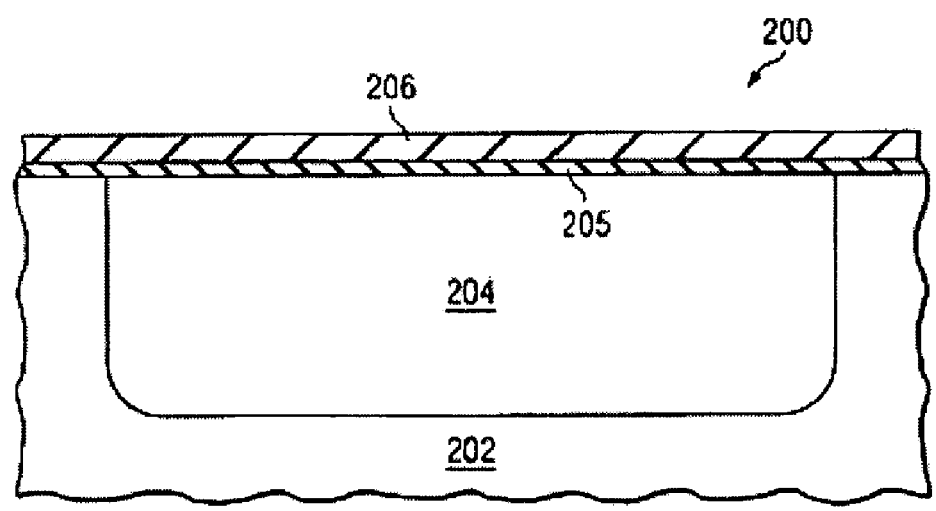

In step 104 of FIG. 1A and with additional reference to FIG. 2B, a dielectric layer 206 is deposited on or over the thin insulate 205 and/or the cleaned substrate 202. The layer 206 may comprise a high-k dielectric material, such as TaN, TiN, $Ta_2O_5$, $HfO_2$, $ZrO_2$, HfSiON, $HfSi_x$, $HfSi_xN_y$, $HfAlO_2$, $NiSi_x$, and/or other suitable materials, and may be formed by atomic layer deposition (ALD), chemical vapor deposition (CVD), plasma enhanced chemical vapor deposition (PECVD), evaporation, and/or other methods. Generally, the layer 206 may have a thickness between ranging between about 3 Angstroms and about 50 Angstroms. With some materials, such as $HfO_2$, the layer 206 may be blanket deposited on or over the substrate 202, while other materials may be selectively deposited. Alternatively, it may be desirable to blanket deposit some materials, including $HfO_2$, in some fabrication processes, while selectively depositing the same materials in other processes.

In the present example, $HfO_2$ is to be deposited as the layer 206 using ALD, which may provide good step coverage, even on large areas, and a dense and pinhole free structure. ALD may be particularly useful for the deposition of metals and metal oxides in high packing density and/or high aspect ratio applications which have relatively demanding thin film requirements. In ALD, films grow with a relatively constant growth rate, and each deposition cycle ideally produces one molecular layer of the deposited material on the substrate surface. Usually, however, the growth rate is below one molecular layer per cycle because the absorbed source chemical molecules may be bulky or the substrate temperature may affect the number of active sites (e.g., —OH groups) on the substrate surface. Metal oxide thin films produced by ALD are generally uniform and have desirable adhesion properties that allow them to become firmly bonded to the substrate surface.

The ALD of a high-k material, such as $HfO_2$, may be achieved by co-reacting a precursor in the presence of a gas, and then purging the precursor using the same gas. For $HfO_2$, ALD may utilize a precursor of Hf, such as $HfCl_4$, or other organometallic Hf sources having a variety of ligands attached to the Hf atom may be utilized. For example, appropriate precursors may include $HfCl_4$ or $Hf(OR)_4$, where R is an alkyl such as $CH(CH_3)_2$; $Hf(tmdh)_4$, where tmdh=2,2,6,6-tetramethyl-3,5-heptanedionato; $Hf(tfac)_4$, where tfac=trifluoroacetylacetonate; or $Hf(NO_3)_4$. Similar precursors may be used for the ALD of other high-k materials, such as $ZrO_2$. Because carbon containing hafnium precursors may result in excess carbon and fluorine incorporation in the metal oxide film, $HfCl_4$ may be desirable because it may result in limited residual chlorine incorporation. $HfCl_4$ may also be a preferred metal oxide precursor because it may be sublimated by injection and vaporization into the process reactor.

$H_2O$ vapor may be selected as an oxygen source for the $HfO_2$. In the present example, an $HfO_2$ deposition process may be carried out at a temperature ranging between about 200° C. and about 400° C., such as about 300° C., with a deposited film thickness ranging between about 3 Angstroms and about 75 Angstroms, such as about 35 Angstroms. The ALD process may be performed in cycles with a series of $HfO_2$ monolayers formed during each cycle until the desired film thickness is achieved for the layer 206.

In step 106 of FIG. 1A and with continued reference to FIG. 2B, a first anneal may be performed on the substrate 202 after the deposition of the layer 206. Although the first anneal may be selected from a variety of anneals, in the present example the first anneal is a hydrogen-based anneal treatment. The hydrogen-based anneal treatment may cause hydrogen ($H_2$) to attach to any residual chlorine (Cl) that may be in the upper monolayers of the layer 206. The resulting effluent HCl may then be driven out of the substrate 202. Accordingly, the hydrogen-based anneal may aid in reducing interface traps on the surface of the layer 206. In the present example, the hydrogen-based anneal is performed using $H_2$, but other gases containing hydrogen, such as $NH_3$ and $SiH_4$, may also be used in the first anneal.

For purposes of illustration, the hydrogen-based anneal may be performed at a temperature between ranging between about 500° C. and about 1000° C., and at a pressure ranging between about 0.1 Torr and about 760 Torr, or, in one embodiment, between about 10 Torr and about 70 Torr. The processing time for the hydrogen anneal may be range between about 10 seconds and about 10 minutes. In the present example, the hydrogen-based anneal is performed for about one minute at a temperature of about 800° C. and a pressure of about 40 Torr. The hydrogen-based anneal may be performed in a rapid thermal process (RTP), in which a single semiconductor substrate may be quickly treated. The hydrogen-based anneal may also be carried out in a conventional furnace where multiple semiconductor substrates are treated in a batch.

In step 108 of FIG. 1A and with continued reference to FIG. 2B, a second anneal may be performed on the layer 206. Although the second anneal may be selected from a variety of anneals, in the present example the second anneal is an oxygen-based anneal treatment. The second anneal may be a diluted oxygen anneal (DOA) performed in the presence of oxygen ($O_2$) or other oxygen sources, such as $N_2O$, NO, or $D_2O$. The oxygen-based anneal may be used following the hydrogen-based anneal of step 106 to improve the electrical characteristics of the layer 206 (and the resulting MOS gate). In one embodiment, the second anneal is performed at a temperature ranging between about 700° C. and about 900° C., and at a pressure ranging between about 1 milliTorr and about 10 Torr. The processing time for the oxygen-based anneal may range between about 1 second and about 60 minutes, and may be selected to support RTP. In the present example, the oxygen-based anneal is performed for about 1 to about 300 seconds at a temperature of about 700° C. to about 900° C. and a pressure of about 0.1 Torr to about 10 Torr.

Typically, the use of high-k materials, such as $HfO_2$, in a MOS gate formation process increases the density of interface traps which causes a flatband voltage shift and a more "stretched out" capacitance-gate voltage (CV) curve. Interface traps may form at sites of imperfect interfaces between the semiconductor substrate and the high-k material. For example, dangling bonds may trap electrons and interfere with the operations performed by electrons that travel through the gate structure.

A related problem associated with the deposition of $HfO_2$ is that the chlorine contamination of the $HfO_2$ film may reduce the insulating characteristics of the film and increase leakage. Secondary ion mass spectrometry (SIMS) depth profile analysis of hydrogen treated $HfO_2$ surfaces has shown that the hydrogen-based anneal treatment may drive a significant amount of Cl out of the $HfO_2$ film from a depth of up to about 3 nm. The Cl content reduction in the $HfO_2$ film may reduce the flatband voltage and improve electron and hole mobility in the gate structure.

Figure 2C:
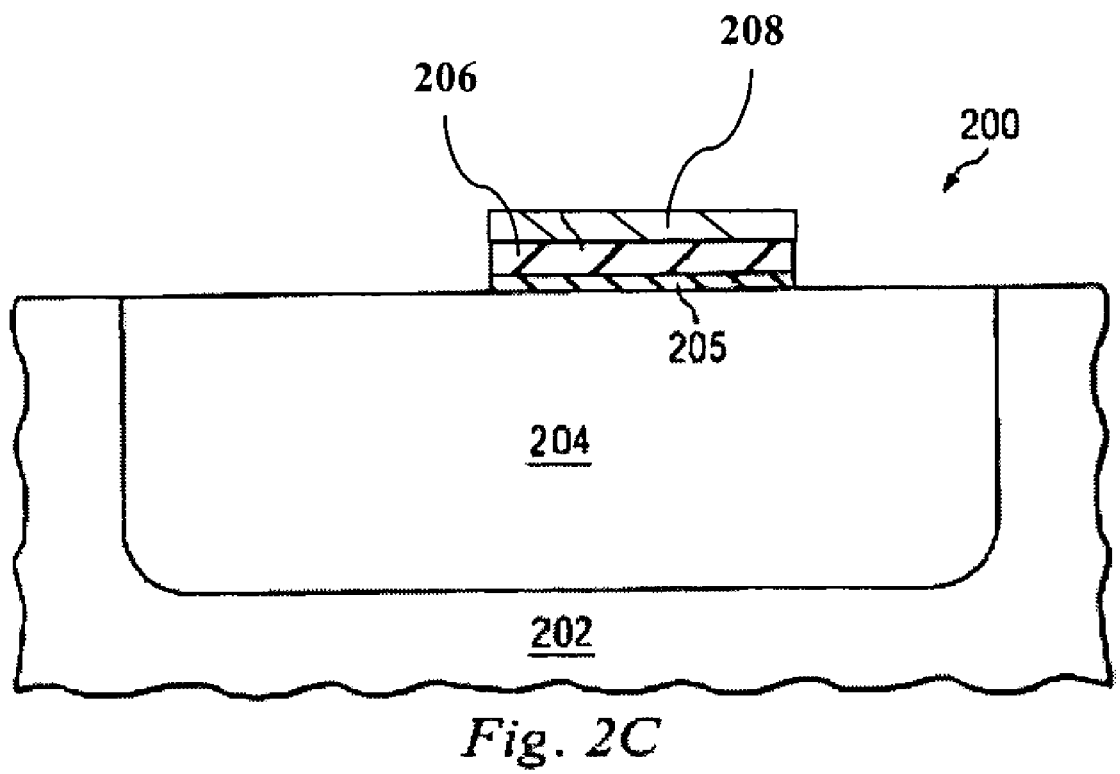

In step 110 of FIG. 1A and with reference to FIG. 2C, a loading treatment may be applied to the layer 206 and the substrate 202. Prior to steps that may follow step 106, the surface of the layer 206 and the substrate 202 may have a plurality of dangling (—OH) bonds. The dangling bonds may have a negative impact upon any proceeding process after any of the preceding steps 102–108. Step 110 optionally applies a loading treatment that may be applied prior to the commencement of the deposition of a polysilicon layer 208. The loading treatment may be performed insitu (within the same process environment) or exsitu (within an individual process) of the polysilicon layer 208 deposition process. The loading treatment may consist of a $H_2$ gas treatment, wherein the gas may be passed across the substrate 202. Alternatively, the loading treatment may include $NH_3$, $SiH_4$, and/or other gases. The substrate 202 may be heated by a rapid thermal chemical vapor deposition (RTCVD) reactor.

Figure 1B:
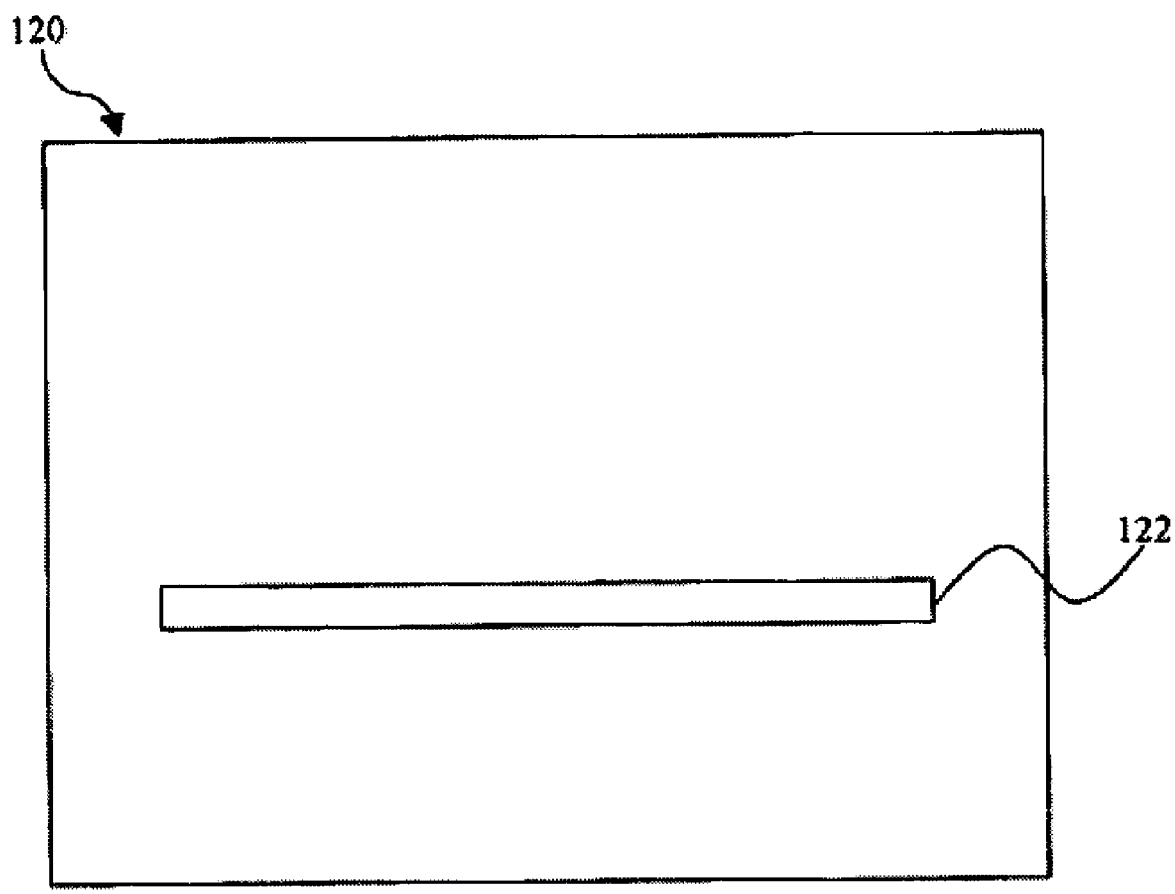
FIG. 1B illustrates a schematic view of one embodiment of a process reactor for providing a loading treatment constructed according to aspects of the present disclosure.

Referring to FIG. 1B and with continued reference to FIG. 2C, in one embodiment the loading treatment may comprise the periodic $H_2$ gas treatment of a pseudo-substrate 122 in a process chamber 120. The process chamber 120 may provide single substrate processing of the substrate 202 and a pseudo-substrate 122. The process chamber 120 may provide for CVD, PECVD, ALD, and/or other processes. The process chamber 120 may comprise a single or multiple substrate 202 and/or pseudo-substrate 122. The pseudo-substrate 122 may comprise Si, SiN, SiGe, diamond, ceramic, SiC, and/or other materials. The pseudo-substrate 122 may be periodically placed into the process chamber 120, and the loading treatment may be applied to the pseudo-substrate 122. The $H_2$ gas treatment of the pseudo-substrate 122 may be carried out at a temperature ranging between about 550° C. and about 750° C. The $H_2$ gas loading treatment of the pseudo-substrate 122 may have a process time ranging between about 1 second and about 5 minutes. The $H_2$ gas employed during the loading treatment may also be excited by a plasma source. The process chamber 120 may have a process environment pressure ranging between about 0.1 Torr and about 80 Torr.

Following the loading treatment, the pseudo-substrate 122 may be removed from the process chamber 120 and the substrate 202 may be placed into the process chamber 120. The pseudo-substrate 122 may be subsequently placed into the process chamber 120 and treated with the $H_2$ gas loading treatment at periodic intervals. For example, the pseudo-substrate 122 may be processed by the loading treatment sequentially after the processing of the substrate 202. Alternatively, the pseudo-substrate 122 may be processed by the loading treatment at greater intervals between processing of the substrate 202. The interval may, for example, comprise five, twelve, or twenty-four substrates 202.

The substrate 202 may be treated in the same process chamber used by later step 112. The substrate 202 may be heated at a loading temperature ranging between about 450° C. and about 650° C., possibly at about 625° C. The loading treatment step 208 process time may range between about 1 second and about 5 minutes, possibly at about 60 seconds. The partial pressure of the $H_2$ gas may range between about 20 Torr and about 80 Torr during step 110 of the loading treatment, possibly about 40 Torr.

At step 112 of FIG. 1A and with reference to FIG. 2C, a polysilicon layer 208 may be deposited on or over the treated layer 206 and the substrate 202, and the poly-silicon layer 208, layer 206, and possibly insulate 205 may be etched or otherwise patterned to at least partially form a poly-silicon gate structure. The poly-silicon layer 208 may be deposited using a process such as low pressure chemical vapor deposition (LPCVD) or ALD upon the layer 206 and the substrate 202 in a single or batch substrate reactor, and may be heated by infra-red (IR) lamps, resistive elements, and/or other sources. The substrate 202 may be heated at a loading temperature ranging between about 550° C. and about 900° C., possibly at about 600° C. The step 112 process time may range between about 1 second and about 20 minutes, such as about 60 seconds. The pressure of the process chamber may range between about 1 milliTorr and about 760 Torr during step 112, such as about 60 milliTorr.

It is understood that additional processing steps may occur between step 102 and step 112. For example, the semiconductor substrate may be moved to a different location, or a chamber in which the first anneal is performed may be evacuated to prepare the chamber for another anneal or treatment. Moreover, while an annealing process is used for purposes of example at steps 106 and 108, it is understood that other treatments may be used instead. Accordingly, additional and/or alternative treatments may be performed on the layer 206, and such treatments include, but are not limited to, other types and/or processing conditions of annealing processes. For example, a treatment may be performed at a lower temperature than may be needed for an annealing process.

Figure 2D:
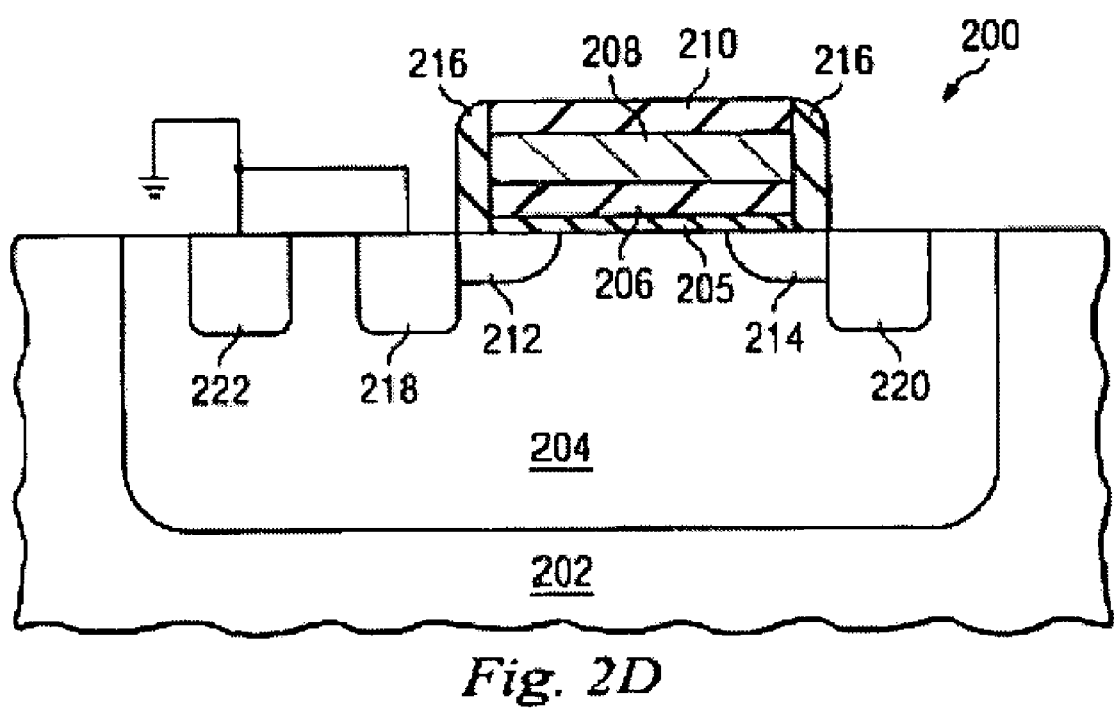

Referring now to FIG. 2D, illustrated is a sectional view of the device 200 shown in FIG. 2C in a subsequent stage of manufacture, in which a silicide layer 210 may be deposited onto or over the polysilicon layer 208. The silicide layer 210 may be a metal silicide using one or more metals such as titanium, tungsten, cobalt, and/or nickel. Source and drain extensions (SDEs) 212, 214 (e.g., lightly P-doped areas for a source and drain) in the substrate 202 may also be formed, such as by low energy implantation. Spacers 216 may then be formed, such as by LPCVD and/or other processes. The spacers 216 may comprise an insulating material such as silicon nitride or silicon oxide. The deposited insulating material may then be etched to form the spacers 216. Heavy p-type doped source and drain regions 218, 220, respectively, may then be formed, such as by ion implantation. A rapid thermal annealing (RTA) step may be used to activate the implanted dopants. In some embodiments, the source 218 may be connected to a n-type doped guard ring 222 which may be grounded.

Thus, the present disclosure introduces a method for fabricating a portion of an integrated circuit on a semiconductor substrate. In one embodiment, the method includes cleaning the surface of the substrate and forming a thin insulate over the substrate. The method also includes depositing a high dielectric constant (high-k) material over the thin insulate, and then performing a hydrogen-based anneal on the high-k material. The method further includes performing an oxygen-based anneal on the high-k material, wherein the hydrogen-based and oxygen-based anneals occur sequentially.

Another embodiment of a method for fabricating a portion of an integrated circuit on a semiconductor substrate is also disclosed herein. Such an embodiment includes placing a pseudo-substrate in a process reactor and applying a loading treatment to the pseudo-substrate. The method further includes removing the pseudo-substrate from the process reactor, placing a device substrate into the process reactor, and forming a poly-silicon layer upon the device substrate.

The present disclosure also provides another method for fabricating a portion of an integrated circuit on a semiconductor substrate. In one embodiment, the method includes cleaning the surface of the substrate; forming a thin insulate on the substrate, and depositing a high dielectric constant (high-k) material upon the thin insulate. An anneal is performed on the high-k material, and a loading treatment is applied upon the high-k material. A poly-silicon layer is formed on the treated high-k material, wherein the anneal and poly-silicon deposition occur sequentially.

A microelectronic device is also introduced in the present disclosure. In one embodiment, the microelectronic device includes a doped well located in a susbtrate and a gate structure located over the substrate. The gate structure includes a dielectric layer located over the doped well, and a semiconductor layer located over the dielectric layer, wherein the dielectric layer is sequentially treated with a first, hydrogen-based anneal and a second, oxygen-based anneal. The microelectronic device also includes source/drain regions located in the doped well on opposing sides of the gate structure and extending partially between the dielectric layer and the doped well.

While the disclosure has been particularly shown and described with reference to exemplary embodiments, it will be understood by those skilled in the art that various changes in form and detail may be made therein without departing from the spirit and scope of the disclosure. For example, various parameters may be altered with respect to the chemical(s) selected for a treatment, as well as processing conditions (e.g., temperature, pressure, time, etc.). In addition, while the present disclosure uses a MOS device for purposes of illustration, it is understood that the present disclosure is equally applicable to dynamic random access memory (DRAM) devices, magnetoresistive RAM (MRAM) devices, capacitors, and other devices that may be fabricated on a semiconductor substrate using a high-k dielectric layer.

What is claimed is:

1. A method for fabricating a portion of an integrated circuit on a semiconductor substrate, the method comprising:
    cleaning the surface of the substrate;
    forming a thin insulate over the substrate;
    depositing a high dielectric constant (high-k) material over the thin insulate;
    performing a hydrogen-based anneal on the high-k material; and
    performing an oxygen-based anneal on the high-k material, wherein the hydrogen-based and oxygen-based anneals occur sequentially.

2. The method of claim 1 further comprising:
    selecting a first temperature, a first pressure, and a first time for the hydrogen-based anneal; and
    selecting a second temperature, a second pressure, and a second time for the oxygen-based anneal.

3. The method of claim 2 wherein the first temperature is selected from a range between about 500° C. and about 1000° C., the first pressure is selected from a range between about 0.1 torr and about 760 torr, and the first time is selected from a range between about 10 seconds and about 10 minutes.

4. The method of claim 3 wherein the first temperature is about 800° C., the first pressure is about 40 torr, and the first time is about 1 minute.

5. The method of claim 2 wherein the second temperature is selected from a range between about 700° C. and about 900° C., the second pressure is selected from a range between about 1 millitorr and about 10 torr, and the second time is selected from a range between about 1 second and about 300 seconds.

6. The method of claim 1 further comprising selecting a first chemical for the hydrogen-based anneal and a second chemical for the oxygen-based anneal, wherein the first and second chemicals are selected based on a chemical composition of the high-k material.

7. The method of claim 6 wherein the first chemical is selected from the group consisting of:
    $H_2$;
    $NH_3$; and
    $SiH_4$.

8. The method of claim 6 wherein the second chemical is selected from the group consisting of:
    $O_2$;
    $N_2O$;

NO; and

D$_2$O.

9. The method of claim 1 wherein the high-k material is deposited using an atomic layer deposition (ALD) process.

10. The method of claim 9 wherein the high-k material is HfO$_2$, and wherein the method further comprises selecting an HfO$_2$ deposition temperature from a range between about 200° C. and about 400° C., and selecting a deposition depth from a range between about 3 Angstroms and about 75 Angstroms.

11. The method of claim 10 wherein a plurality of cycles of the ALD process are performed until the selected deposition depth is attained.

12. The method of claim 1 wherein the substrate comprises diamond.

13. A method for fabricating a portion of an integrated circuit on a semiconductor substrate, the method comprising:

placing a pseudo-substrate in a process reactor;
applying a loading treatment to the pseudo-substrate;
removing the pseudo-substrate from the process reactor;
placing a device substrate into the process reactor; and
forming a poly-silicon layer upon the device substrate.

14. The method of claim 13 wherein the pseudo-substrate comprises a material selected from the group consisting of:
silicon; and
diamond.

15. The method of claim 13 further comprising:
selecting a first temperature, a first pressure, and a first time for the loading treatment; and
selecting a second temperature, a second pressure, and a second time for the poly-silicon layer formation.

16. The method of claim 15 wherein the first temperature is selected from a range between about 550° C. and about 750° C., the first pressure is selected from a range between about 0.1 torr and about 80 torr, and the first time is selected from a range between about 1 second and about 5 minutes.

17. The method of claim 16 wherein the first temperature is about 625° C., the first pressure is about 40 torr, and the first time is about 1 minute.

18. The method of claim 15 wherein the second temperature is selected from a range between about 700° C. and about 900° C., the second pressure is selected from a range between about 1 millitorr and about 760 torr, and the second time is selected from a range between about 1 second and about 20 minutes.

19. The method of claim 13 further comprising selecting a chemical for the loading treatment.

20. The method of claim 19 wherein the chemical is selected from the group consisting of:
H$_2$;
NH$_3$; and
SiH$_4$.

21. The method of claim 13 wherein the loading treatment is performed within the same process environment as the poly-silicon formation.

22. The method of claim 13 wherein the loading treatment is performed within an individual process environment.

23. The method of claim 13 wherein the loading treatment employs a plasma.

24. A method for fabricating a portion of an integrated circuit on a semiconductor substrate, the method comprising:
cleaning the surface of the substrate;
forming a thin insulate over the substrate;
depositing a high dielectric constant (high-k) material over the thin insulate;
performing a hydrogen-based anneal on the high-k material;
performing an oxygen-based anneal on the high-k material, wherein the hydrogen-based and oxygen-based anneals occur sequentially;
applying a loading treatment to the high-k material; and
forming a poly-silicon layer on the treated high-k material, wherein the loading treatment and poly-silicon deposition occur sequentially.

25. The method of claim 24 further comprising:
selecting a first temperature, a first pressure, and a first time for the hydrogen-based anneal;
selecting a second temperature, a second pressure, and a second time for the oxygen-based anneal;
selecting a third temperature, a third pressure, and a third time for the loading treatment; and
selecting a fourth temperature, a fourth pressure, and a fourth time for the poly-silicon layer formation.

26. The method of claim 25 wherein the first temperature is selected from a range between about 500° C. and about 1000° C., the first pressure is selected from a range between about 0.1 torr and about 760 torr, and the first time is selected from a range between about 10 seconds and about 10 minutes.

27. The method of claim 26 wherein the first temperature is about 800° C., the first pressure is about 40 torr, and the first time is about 1 minute.

28. The method of claim 25 wherein the second temperature is selected from a range between about 700° C. and about 900° C., the second pressure is selected from a range between about 1 millitorr and about 10 torr, and the second time is selected from a range between about 1 second and about 300 seconds.

29. The method of claim 25 wherein the third temperature is selected from a range between about 450° C. and about 650° C., the third pressure is selected from a range between about 0.1 torr and about 80 torr, and the third time is selected from a range between about 1 seconds and about 5 minutes.

30. The method of claim 29 wherein the third temperature is about 500° C., the third pressure is about 40 torr, and the third time is about 2 minutes.

31. The method of claim 25 wherein the fourth temperature is selected from a range between about 700° C. and about 900° C., the fourth pressure is selected from a range between about 1 millitorr and about 760 torr, and the fourth time is selected from a range between about 1 second and about 20 minutes.

32. The method of claim 24 further comprising selecting a first chemical for the hydrogen-based anneal, a second chemical for the oxygen-based anneal, and a third chemical for the loading treatment, wherein the first, second, and third chemicals are selected based on a chemical composition of the high-k material.

33. The method of claim 32 wherein the first chemical is selected from the group consisting of:
H$_2$;
NH$_3$; and
SiH$_4$.

34. The method of claim 32 wherein the second chemical is selected from the group consisting of:
O$_2$;
N$_2$O;
NO; and
D$_2$O.

35. The method of claim 24 wherein the high-k material is deposited using an atomic layer deposition (ALD) process.

36. The method of claim 35 wherein the high-k material is HfO$_2$, and wherein the method further comprises selecting a HfO$_2$ deposition temperature from a range between about 200° C. and about 400° C., and selecting a deposition depth from a range between about 3 Angstroms and about 75 Angstroms.

37. The method of claim 35 wherein a plurality of cycles of the ALD process are performed until a selected deposition depth is attained.

38. The method of claim 24 wherein the loading treatment is performed within the same process environment of the poly-silicon formation.

39. The method of claim 24 wherein the loading treatment is performed within an individual process environment.

40. The method of claim 24 wherein the loading treatment employs a plasma.

41. The method of claim 24 wherein the substrate comprises diamond.

42. A method for fabricating a portion of an integrated circuit on a semiconductor substrate, the method comprising:
cleaning the surface of the substrate;
forming a thin insulate on the substrate;
depositing a high dielectric constant (high-k) material upon the thin insulate;
performing an anneal on the high-k material;
applying a hydrogen-containing gas loading treatment upon the annealed high-k material; and
forming a poly-silicon layer on the treated high-k material, wherein the hydrogen-containing gas loading treatment and poly-silicon deposition occur sequentially.

43. The method of claim 42 further comprising:
selecting a first temperature, a first pressure, and a first time for the hydrogen-containing gas loading treatment; and
selecting a second temperature, a second pressure, and a second time for the poly-silicon layer formation.

44. The method of claim 43 wherein the first temperature is selected from a range between about 450° C. and about 650° C., the first pressure is selected from a range between about 0.1 torr and about 80 torr, and the first time is selected from a range between about 1 second and about 5 minutes.

45. The method of claim 44 wherein the first temperature is about 500° C., the first pressure is about 40 torr, and the first time is about 2 minutes.

46. The method of claim 43 wherein the second temperature is selected from a range between about 700° C. and about 900° C., the second pressure is selected from a range between about 1 millitorr and about 760 torr, and the second time is selected from a range between about 1 second and about 20 minutes.

47. The method of claim 42 further comprising selecting a chemical hydrogen-containing gas for the hydrogen-containing gas loading treatment.

48. The method of claim 47 wherein the hydrogen-containing gas is selected from the group consisting of:
$H_2$;
$NH_3$; and
$SiH_4$.

49. The method of claim 42 wherein the hydrogen-containing gas loading treatment is performed within the same process environment of the poly-silicon formation.

50. The method of claim 42 wherein the hydrogen-containing gas loading treatment is performed within an individual process environment.

51. The method of claim 42 wherein the hydrogen-containing gas loading treatment employs a plasma.

52. The method of claim 42 wherein the high-k material is deposited using an atomic layer deposition (ALD) process.

53. The method of claim 52 wherein the high-k material is HfO$_2$, and wherein the method further comprises selecting an HfO$_2$ deposition temperature from a range between about 200° C. and about 400° C., and selecting a deposition depth from a range between about 3 Angstroms and about 75 Angstroms.

54. The method of claim 52 wherein a plurality of cycles of the ALD process are performed until a selected deposition depth is attained.

55. The method of claim 42 wherein the substrate comprises diamond.

* * * * *